US010825912B2

(12) United States Patent
Pelzel et al.

(10) Patent No.: US 10,825,912 B2
(45) Date of Patent: Nov. 3, 2020

(54) INTEGRATED EPITAXIAL METAL ELECTRODES

(71) Applicant: IQE plc, Cardiff (GB)

(72) Inventors: Rodney Pelzel, Emmaus, PA (US); Andrew Clark, Mountain View, CA (US); Rytis Dargis, Oak Ridge, NC (US); Patrick Chin, Zhubei (TW); Michael Lebby, San Francisco, CA (US)

(73) Assignee: IQE plc, Cardiff (GB)

( * ) Notice: Subject to any disclaimer, the term of this patent is extended or adjusted under 35 U.S.C. 154(b) by 22 days.

(21) Appl. No.: 16/178,495

(22) Filed: Nov. 1, 2018

(65) Prior Publication Data

US 2019/0074365 A1 Mar. 7, 2019

Related U.S. Application Data

(63) Continuation of application No. 15/712,002, filed on Sep. 21, 2017, now Pat. No. 10,128,350.
(Continued)

(51) Int. Cl.
*H01L 45/00* (2006.01)
*H01L 27/24* (2006.01)
(Continued)

(52) U.S. Cl.
CPC ........ *H01L 29/511* (2013.01); *H01L 21/0242* (2013.01); *H01L 21/02123* (2013.01);
(Continued)

(58) Field of Classification Search
CPC ......... H01L 21/02381; H01L 21/02505; H01L 29/517; H01L 23/66; H01L 41/00; H01L 41/083
See application file for complete search history.

(56) References Cited

U.S. PATENT DOCUMENTS 5,594,280 A 1/1997 Sekiguchi et al.
5,828,080 A 10/1998 Yano et al.
(Continued)

FOREIGN PATENT DOCUMENTS

EP 0 293 232 11/1988
EP 0 407 133 1/1991
(Continued)

OTHER PUBLICATIONS

Gsell et al., "Epitaxial films of metals from the platinum group (Ir, Rh, Pt and Ru) on YSZ-buffered Si(111)," Elsevier Journal of Crystal Growth, vol. 311 (2009) 3731-3736.
(Continued)

*Primary Examiner* — Bradley Smith
*Assistant Examiner* — David J Goodwin
(74) *Attorney, Agent, or Firm* — Haley Guiliano LLP

(57) ABSTRACT

Systems and methods are described herein to include an epitaxial metal layer between a rare earth oxide and a semiconductor layer. Systems and methods are described to grow a layered structure, comprising a substrate, a first rare earth oxide layer epitaxially grown over the substrate, a first metal layer epitaxially grown over the rare earth oxide layer, and a first semiconductor layer epitaxially grown over the first metal layer.

39 Claims, 9 Drawing Sheets

Related U.S. Application Data

(60) Provisional application No. 62/398,416, filed on Sep. 22, 2016.

(51) Int. Cl.
*H01L 29/51* (2006.01)
*H01L 21/02* (2006.01)

(52) U.S. Cl.
CPC .. *H01L 21/02178* (2013.01); *H01L 21/02293* (2013.01); *H01L 21/02381* (2013.01); *H01L 21/02414* (2013.01); *H01L 21/02433* (2013.01); *H01L 21/02483* (2013.01); *H01L 21/02488* (2013.01); *H01L 21/02491* (2013.01); *H01L 21/02502* (2013.01); *H01L 21/02505* (2013.01); *H01L 21/02521* (2013.01); *H01L 29/517* (2013.01)

(56) References Cited

U.S. PATENT DOCUMENTS

| | | | |
|---|---|---|---|
| 6,045,626 | A | 4/2000 | Yano et al. |
| 6,121,647 | A | 9/2000 | Yano et al. |
| 7,216,962 | B2 | 5/2007 | Miyazawa |
| 7,384,481 | B2 | 6/2008 | Atanackovic |
| 7,605,531 | B1 | 10/2009 | Lebby et al. |
| 7,643,526 | B1 | 1/2010 | Lebby et al. |
| 8,698,119 | B2 * | 4/2014 | Tendulkar ............ H01L 45/1608 257/4 |
| 8,748,900 | B1 | 6/2014 | Dargis et al. |
| 8,796,121 | B1 | 8/2014 | Dargis et al. |
| 8,878,188 | B2 | 11/2014 | Dargis et al. |
| 9,876,483 | B2 | 1/2018 | Ortiz et al. |
| 10,566,944 | B2 | 2/2020 | Pelzel et al. |
| 2002/0015852 | A1 | 2/2002 | Noguchi et al. |
| 2002/0089023 | A1 | 7/2002 | Yu et al. |
| 2003/0136331 | A1 | 7/2003 | Ami et al. |
| 2004/0053460 | A1 | 3/2004 | Higuchi et al. |
| 2005/0179342 | A1 | 8/2005 | Higuchi et al. |
| 2005/0218466 | A1 | 10/2005 | Kondo et al. |
| 2007/0132003 | A1 | 6/2007 | Takashima et al. |
| 2007/0138506 | A1 | 6/2007 | Braddock |
| 2008/0217695 | A1 | 9/2008 | Atanackovic |
| 2010/0109047 | A1 | 5/2010 | Clark et al. |
| 2010/0327377 | A1 | 12/2010 | Dewey et al. |
| 2011/0057292 | A1 | 3/2011 | Hu |
| 2011/0121689 | A1 | 5/2011 | Grannen et al. |
| 2012/0264284 | A1 | 10/2012 | Wang et al. |
| 2013/0032858 | A1 | 2/2013 | Clark et al. |
| 2013/0062610 | A1 * | 3/2013 | Clark ................ H01L 33/10 257/76 |
| 2013/0240874 | A1 | 9/2013 | Maekawa et al. |
| 2014/0065790 | A1 * | 3/2014 | Wang ................ H01L 45/10 438/382 |
| 2014/0118090 | A1 | 5/2014 | Grannen et al. |
| 2014/0167057 | A1 | 6/2014 | Arkun |
| 2014/0252423 | A1 | 9/2014 | Tsao et al. |
| 2015/0236244 | A1 | 8/2015 | Kijima et al. |
| 2015/0244346 | A1 | 8/2015 | Feng et al. |
| 2015/0280687 | A1 | 10/2015 | Burak et al. |
| 2015/0326200 | A1 | 11/2015 | Grannen et al. |
| 2016/0118957 | A1 | 4/2016 | Burak et al. |
| 2016/0240375 | A1 | 8/2016 | Dargis et al. |
| 2017/0141750 | A1 | 5/2017 | Pelzel et al. |
| 2017/0345646 | A1 | 11/2017 | Chen et al. |
| 2018/0138284 | A1 | 5/2018 | Pelzel et al. |
| 2019/0027574 | A1 | 1/2019 | Dargis et al. |
| 2019/0172923 | A1 | 6/2019 | Pelzel et al. |

FOREIGN PATENT DOCUMENTS

| | | |
|---|---|---|
| EP | 0 498 580 | 8/1992 |
| EP | 0 602 532 | 6/1994 |
| EP | 1 486 590 | 12/2004 |
| WO | WO 02/09160 | 1/2002 |
| WO | WO 2009/096931 | 8/2009 |
| WO | WO 2017222990 | 12/2017 |
| WO | WO 2018/057797 | 3/2018 |
| WO | WO 2019060737 | 3/2019 |

OTHER PUBLICATIONS

International Search Report and Written Opinion in PCT Application No. PCT/US2017/052803, dated Jan. 9, 2018, 20 pages.

Krishnaswamy et al., "High-Q FBARs Using Epitaxial AlN Films," 2006 IEEE Ultrasonics Symposium, (2006) 4 pages.

Lebby et al., "Driving 'on-silicon' solutions in lighting, power electronics & PVs" Semiconductor Today, Compounds & Advanced Silicon vol. 6, Issue 8, Oct./Nov. 2011 (4 pages).

Li et al., "Investigation on Molybdenum and its Conductive Oxides as p-Type Metal Gate Candidates", Journal of the Electrochemical Society, 155 (7) May 2, 2008, pp. H481-H484.

Lin et al., "Effect of Nitrogen on the physical properties and work function of NoNx Cap layers on Hf02 gate dielectrics", vol. 3, No. 12, Oct. 16, 2014, pp. N161-N165.

Moy, "Avago Technologies' FBAR Filter Technology Designed Into Latest Generation of 4G & LTE Smartphones," Avago Technologies, Oct. 11, 2012, 4 pages.

Okamoto et al., "Epitaxial growth of AlN on single crystal Mo substrates," Thin Solid Films, 516 (2008) 4809-4812, Feb. 2007, 4 pages.

Saint-Girons et al., "Monolithic integration of InP based heterostructures on silicon using crystalline Gd2O3 buffers", American Institute of Physics, Applied Physics Letters 91, 241912 (2007) 4 pages.

Smith R. S. et al., Control of thick single crystal erbium oxide growth on silicon, Journal of Crystal Growth, Elsevier, Amsterdam, NL, vol. 311, No. 7, Mar. 15, 2009, pp. 2199-2204.

Tanifuji et al., "Discussion of Millimeter Wave FBAR with Very Thin AlN Film Fabricated Using MOCVD Method," 2009 IEEE International Ultrasonics Symposium Proceedings, 4 pages.

Yang et al., "AlN Epitaxial Film Growth Using MOCVD for a GHz-band FBAR," Journal of the Korean Physical Society, vol. 55, No. 3, Sep. 2009, pp. 1132-1135.

Yokoyama et al., "New Electrode Material for Low-loss and High-Q FBAR Filters," 2004 IEEE International Ultrasonics, Ferroelectrics, and Frequency Control Joint 50th Anniversary Conference, (2004), 4 pages.

Zheng et al., "High Optical Quality Polycrystalline Indium Phosphide Grown on Metal Substrates by Metalorganic Chemical Vapor Deposition," Journal of Applied Physics 111, 123112 (2012) 7 pages.

* cited by examiner

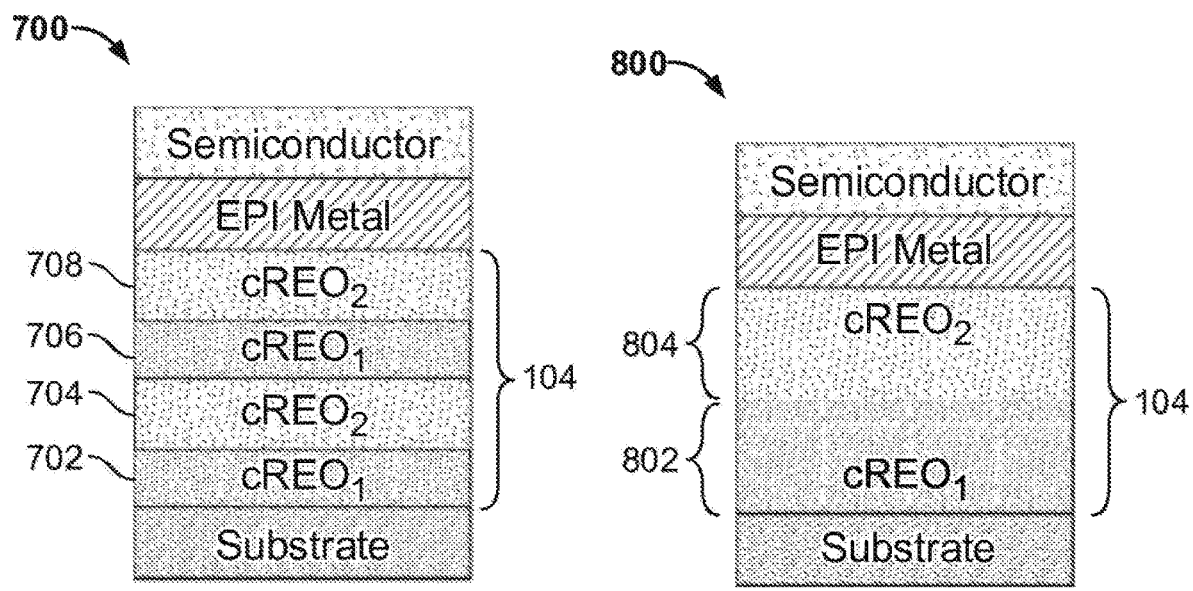
FIG. 7
FIG. 8
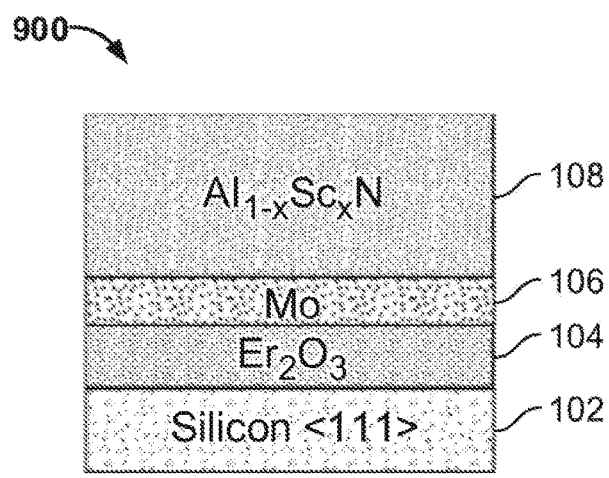
FIG. 9

INTEGRATED EPITAXIAL METAL ELECTRODES

CROSS REFERENCE TO RELATED APPLICATIONS

This application is a continuation of U.S. patent application Ser. No. 15/712,002 which claims the benefit under 35 U.S.C. § 119(e) of U.S. Provisional Application No. 62/398,416, filed on Sep. 22, 2016, each of which is hereby incorporated by reference herein in its entirety. This application is related to co-pending PCT Application No. PCT/US2017/052803 filed Sep. 21, 2017, which is hereby incorporated herein by reference in its entirety.

FIELD OF USE

This application relates to semiconductor designs, and more specifically, to a layered structure for integrated epitaxial metal electrodes, in which an epitaxial metal is introduced between a lower epitaxial oxide and upper epitaxial semiconductor.

BACKGROUND

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of the crystalline layer. The crystalline layer can be, in some examples, lattice matched or lattice coincident. A lattice matched crystalline layer can have the same or a very similar lattice spacing as the top surface of the crystalline substrate. A lattice coincident crystalline layer can have a lattice spacing that is an integer multiple of the lattice spacing of the crystalline substrate. The quality of the epitaxy is based in part on the degree of crystallinity of the crystalline layer. Practically, a high quality epitaxial layer will be a single crystal with minimal defects and few or no grain boundaries. Traditionally, metal contact layers are applied to an epitaxial structure at some point in the upstream processing. With today's complex epitaxial structures often incorporating more than one device functionality, this can require extensive etching and deposition of metals on wafers with a large amount of topography.

Interactions between metals and semiconductors are often critical to device operation. One example of such an interaction between a metal and a semiconductor occurs in a thin film resonator such as an RF filter where the overall acoustic performance is defined by the product of the acoustic impedance of the electrode and the acoustic impedance of the piezoelectric material. In fact, to access high resonant frequencies it is essential to make both the electrode and the piezoelectric material quite thin. This is summarized in FIG. 17, which shows resonant frequencies as a function of AlN thickness for different thickness metal electrodes (from S. Tanifuji et al, Proceedings 2009 IEEE International Ultrasonic Symposium, p. 2170, the entirety of which is incorporated by reference). Here, crystal quality is also important because without it resistivity would increase as thickness decrease due to an increasing effect of defects and grain boundaries in polycrystalline metal layers.

Growth of InP has also been attempted on metal over silicon engineered substrates, as described in Zheng et al, Journal of Applied Physics, vol. 111 p. 123112 (2012), the entirety of which is incorporated by reference. However, Zheng describes films that are polycrystalline, not epitaxial.

Epitaxial growth of metals on yttria stabilized zirconia (YSZ) is described in Gsell at all, Journal of Crystal Growth, vol. 311, p. 3731 (2009), the entirety of which is incorporated by reference. Gsell describes separating the metal from the underlying silicon substrate by using YSZ as this prevents the unwanted siliciding of any epitaxial metal. YSZ is a sputtered material (or deposited with pulsed laser deposition) using zirconia and yttria targets. It is not a single crystal material, has grain boundaries, and can be of mixed crystallinity (cubic and tetragonal). Thus, it is a suboptimal template for epitaxial growth of metals. In addition, control of the YSZ/silicon interface is technically challenging.

Accordingly, epitaxially growing metal of good crystal quality over semiconductor materials has proven to be difficult.

SUMMARY

Systems and methods are described herein for the use of integrated epitaxial metal electrodes in layered structures over which semiconductor layers may be grown. Systems and methods described herein may include a layered structure, comprising a substrate, a first rare earth oxide layer epitaxially grown over the substrate, a first metal layer epitaxially grown over the rare earth oxide (REO) layer, and a first semiconductor layer epitaxially grown over the first metal layer. In some embodiments, the substrate includes one or more group IV element including but not limited to silicon (Si), germanium (Ge), silicon on insulator (SOI), SiGe. In some embodiments, the substrate has a crystal orientation of either <100> or <111> with a miscut of upto 10 degrees. In some embodiments, the substrate includes elements from group III and group V including but not limited to GaAs, InP, GaN. In some embodiments, the substrate is another metal oxide, including but not limited to $Ga_2O_3$, $Al_2O_3$.

In some embodiments, rare earth oxide layer includes a rare earth metal element selected from a lanthanide group of a periodic table, scandium (Sc) and yttrium (Y). In some embodiments, the REO layer is composed of an REO having an oxygen-to-metal ratio between 1 and 2. In some embodiments, the first metal layer includes a metal element selected from a transition metal group of a periodic table. In some embodiments, the first semiconductor layer includes an element selected from group III, group IV, group V. In some embodiments, the substrate is composed of silicon, the REO layer is composed of erbium oxide having an oxygen-to-metal ratio of 1.5 ($ErO_{1.5}$), and the first metal layer is composed of molybdenum (Mo). In some embodiments, the first semiconductor layer is composed of $Al_xSc_{1-x}N$ ($0 \leq x < 1$). In some embodiments, the substrate, when composed of Si, has a crystal orientation of <100>, the REO layer, when composed of $ErO_{1.5}$, has a crystal orientation of <110>, and the first metal layer, when composed of Mo, has a crystal orientation of <211>. For example, the substrate that is composed of silicon may have an orientation of <111>, the REO layer, when composed of $ErO_{1.5}$ has a crystal orientation of <110>. In some embodiments, the REO layer is composed of multiple rare metal oxide components, and the multiple rare metal oxide components have different metal elements or different oxygen-to-metal ratios.

In some embodiments, the REO layer includes a first sublayer composed of a first REO and a second sublayer composed of a second REO. In some embodiments, the REO layer includes a first region composed of a first REO and a second region composed of a second REO, and wherein the first region transits to the second region in a graded pattern. In some embodiments, the REO layer includes a first sublayer composed of a first REO and a second sublayer composed of a second REO, and wherein the first sublayer and the second sublayer are repeated in a super lattice structure. In some embodiments, the second metal oxide further comprises a group III element. In some embodiments, the first metal layer includes a first sublayer composed of a first metal and a second sublayer composed of a second metal. In some embodiments, the first metal layer includes a first region composed of a first metal and a second region composed of a second metal, and wherein the first region transits to the second region in a graded pattern. In some embodiments, metal layer includes a first sublayer composed of a first metal and a second sublayer composed of a second metal, and wherein the first sublayer and the second sublayer are repeated in a super lattice structure. In some embodiments, layered structure further comprises a second metal layer epitaxially grown over the semiconductor layer.

In some embodiments, the layered structure further comprises a second semiconductor layer epitaxially grown over the second metal layer. In some embodiments, the layered structure further comprises up to 20 repetitions of a combination of a metal layer and a semiconductor layer. In some embodiments, the layered structure further comprises repetitions of a combination of a metal layer and a REO layer. In some embodiments, the layered structure further comprises a second REO layer grown over the semiconductor layer. In some embodiments, a second metal layer epitaxially grown over the second REO layer. In some embodiments, the layered structure of claim 1, further comprising an epitaxial layer grown from the first metal layer, wherein the epitaxial layer includes a component selected from a group of a two-dimensional (2D) material, a cap layer, and an insulator. In some embodiments, the 2D material is selected from a group of graphene and transition metal disulfide. In some embodiments, the cap layer is composed of a material selected from a group of metal oxides and metal silicides. In some embodiments, the insulator is composed of a REO. In some embodiments, an interlayer that transits from the first metal layer to the first semiconductor layer. In some embodiments, the interlayer is composed of one or more components selected from a group of metal nitride, metal pnictide and a template 2D electrode.

In some embodiments, an interlayer that transits from the first REO layer to the first metal layer. In some embodiments, the interlayer is grown with a metal component from the first metal layer and oxygen. In some embodiments, the first metal layer has a non-continuous pattern with a first gap space between a first part of the first metal layer and a second part of the first metal layer, and the first semiconductor layer is grown over both the gap and the metal region.

BRIEF DESCRIPTION OF DRAWINGS

Further features of the disclosure, its nature and various advantages will be apparent upon consideration of the following detailed description, taken in conjunction with the accompanying drawings, in which:

FIGS. 3-16 depict various examples of layered structures, each of which is a specific example of the layered structure shown in FIG. 1, according to an illustrative embodiment;

DETAILED DESCRIPTION

Figure 1:
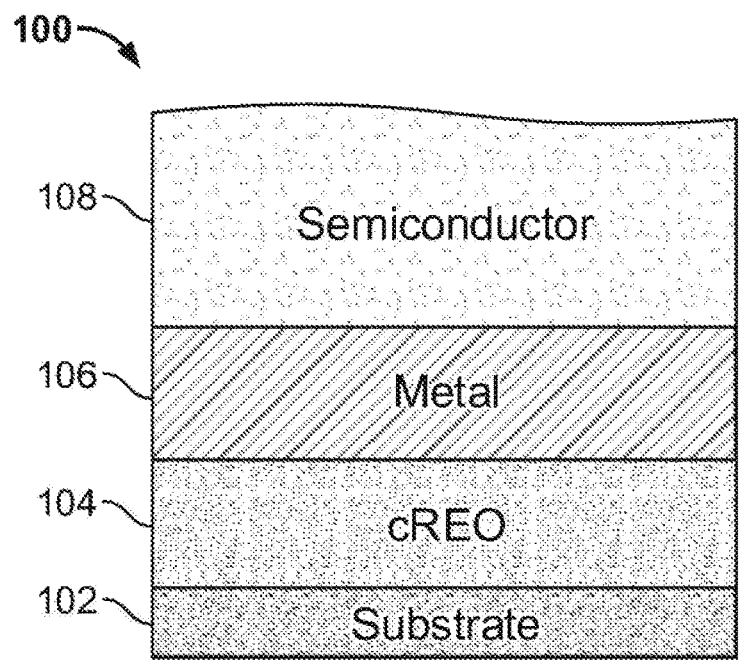
FIG. 1 depicts a layered structure to grow an epitaxial metal layer between a substrate and a semiconductor layer, according to an illustrative embodiment.

Structures and methods described herein provide an integrated epitaxial metal electrode that incorporates an epitaxial metal within an epitaxial stack thereby incorporating a buried contact layer. The structures and methods disclosed herein include high quality epitaxial metal layers and the ability to continue growth of a semiconductor material above the epitaxial metal layer. In one example, a crystalline REO layer may be epitaxially grown over a substrate or semiconductor, and a metal layer may be epitaxially grown over the crystalline REO layer. A semiconductor layer may be grown over the epitaxial metal layer. An REO layer is a layer that contains one or more rare earth (RE) species and oxygen. The rare earth species include Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy). Holmium (Ho), Erbium (Er), Thulium (Tm), Ytterbium (Yb), Luthium (Lu), Scandium (Sc) and Yttrium (Y).

REOs are known to exhibit fluorite-type structures. These structures exhibit morphology differences as a function of the atomic weight of the rare-earth cation present in the oxide, among any other factors.

In particular, oxides comprising lighter rare-earths form cubic $CaF_2$-type crystal structure as a result of possible ionization states of +2 and/or +3 and/or +4. Oxides having this crystal structure exhibit significant net charge defect due to a multiplicity of possible oxidation states (for rare-earth oxides).

On the other hand, oxides formed from heavier rare-earths (e.g., $RE_2O_3$, etc.), exhibit a distorted $CaF_2$-type crystal structure which includes anion vacancies due to an ionization state of RE<3+>. The crystal structure associated with rare-earth oxides of heavier rare earths is also known as "Bixbyite."

An illustrative example of a rare-earth oxide having the formula $RE_2O_3$, is $Er_2O_3$. The crystal structure of a unit cell of $Er_2O_3$ is an oxygen-vacancy-derived fluorite derivative (i.e., Bixbyite structure). REO dielectric layers may comprise an assemblage of these unit cells.

The number and position of the anion vacancies determines the crystal shape of the $RE_2O_3$ unit cell. The crystal shape of this cell may be engineered to provide a suitable match to the lattice constant of the underlying semiconductor substrate. Oxygen vacancies along the body diagonal and/or the face diagonal lead to a C-type cubic structure. For example, two anion vacancies per fluorite unit cell causes the unit cell of $Er_2O_3$ to increase to nearly twice the unit cell size of Si. This, in turn, enables low-strain, single-phase $Er_2O_3$ to be epitaxially grown directly on a silicon substrate.

Furthermore, the number and position of the anion vacancies may be engineered to induce a desired strain (tensile or compressive) in the dielectric layer and/or overgrown layers. For example, in some embodiments, strain in the semiconductor layer is desired in order to affect carrier mobility.

Each fluorite unit cell has two oxygen vacancies, which lie along the body diagonal. The presence of these two oxygen vacancies causes the $Er_2O_3$ unit cell to double in size, thereby doubling its lattice constant, which provides a suitable match to the lattice constant of <100> silicon.

In some examples, oxygen vacancies lie at the ends of the face diagonal. In some other examples, oxygen vacancies are distributed between the ends of the face diagonal and the body diagonal.

A buried metal contact layer may be grown using epitaxial deposition of metal over a semiconductor layer. The epitaxial metal layer may be grown directly on the semiconductor layer and/or directly on a substrate. In some examples, an optional transitional layer may be between the epitaxial metal layer and the underlying semiconductor layer, and/or between the epitaxial metal layer and the underlying substrate. As well as the electrical advantages a buried contact layer would bring, there are often interactions between a metal and the overlying semiconductor that may be utilized. These interactions, such as in RF filters, are more useful when the interface between the metal and semiconductor (and any intervening interface) is high quality with few defects. In addition, epitaxial metals may be made thinner than sputtered metals while preserving high film quality. This is in part because epitaxial interfaces are higher quality, and as layers are thinned, the interfaces become a larger proportion of the overall material. Thus, while a thick film is less affected by poor quality interfaces and its properties are dominated by the bulk material properties, the properties of a thin film are more dominated by the interfacial properties. Thus, high quality interfaces important when depositing thin films.

In addition, an epitaxial metal layer may be used to modify the reflectivity of an epitaxial stack of layers. For devices where light emission is from the top surface, light that is emitted towards the substrate is generally considered to be lost to the overall output power. In vertical cavity surface emitting lasers (VCSELs), for example, the back mirror has to have a reflectivity >99.8%. This is difficult to achieve solely through semiconductor materials.

Figure 18:
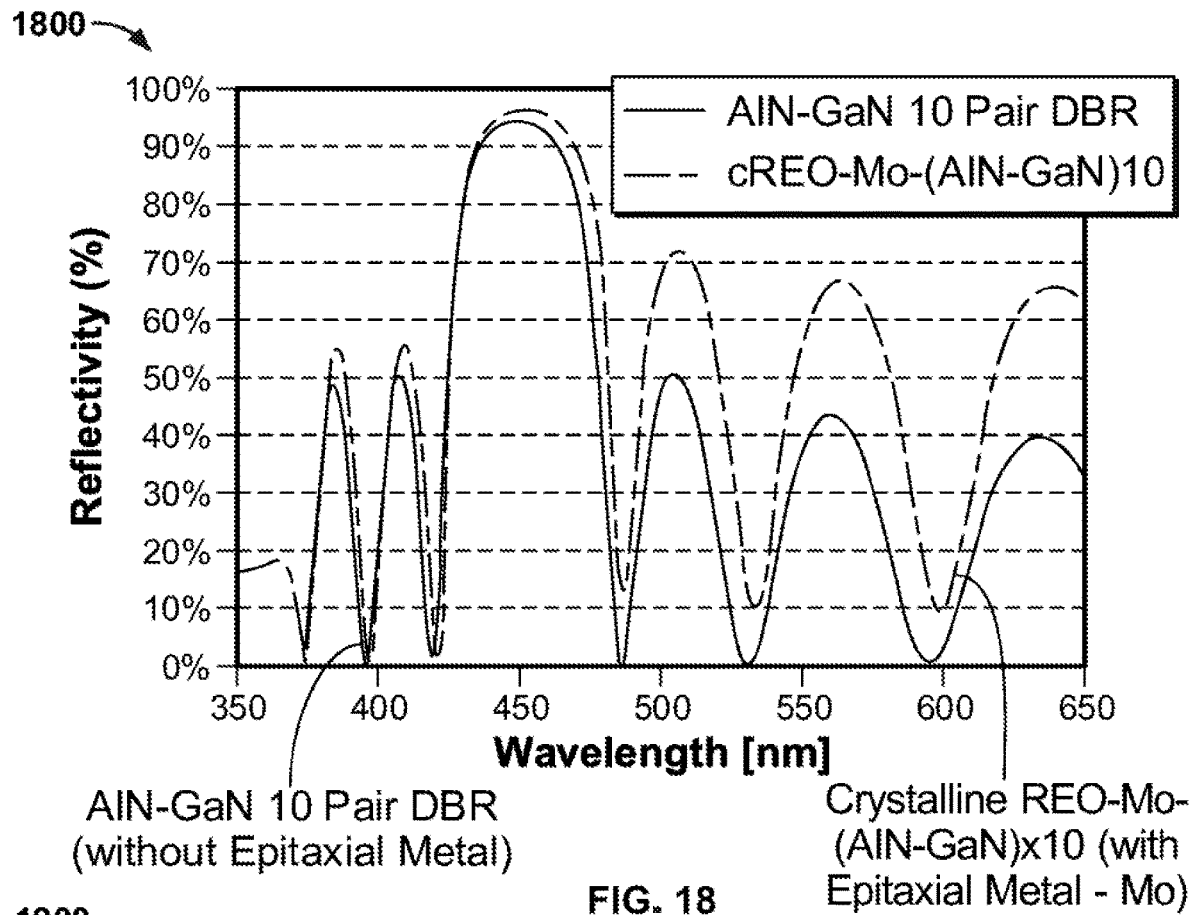
FIG. 18, depicts calculated Distributed Bragg Reflector (DBR) reflectivity with and without an epitaxial metal electrode, where the addition of a crystalline REO and a metal beneath a standard III-nitride DBR increases peak reflectivity by 2%.

FIG. 18, shows a graph depicting calculated DBR reflectivity with and without an epitaxial metal electrode, where the addition of a crystalline rare earth oxide and a metal beneath a standard III-nitride DBR increases peak reflectivity by 2%. A III-nitride material is a material comprising a Group III species and nitrogen. The Group III species may include one or more elements in Group III of the Periodic Table, including B, Al, Ga, In, and Tl. The III-nitride layer may be a compound that includes multiple Group III elements. The III-nitride layer may include binary compounds such as GaN, ternary compounds such as $Al_xGa_{1-x}N$ ($0 \le x \le 1$) and $In_xGa_{1-x}N$ ($0 \le x \le 1$), quaternary compounds such as $In_xAl_yGa_{1-x-y}N$ ($0 \le x,y \le 1$), and quinary compounds such as $Ga_xIn_{1-x}As_ySb_zN_{1-y-z}$ ($0 \le x,y,z \le 1$). The III-nitride layer may be undoped, unintentionally doped, or doped with donor or acceptor dopants.

A crystalline rare earth oxide (REO) epitaxial layer may be used as a template for epitaxial metal on semiconducting substrates such as silicon. Substrates other than silicon may be used, and examples include germanium, Si—Ge alloys, sapphire, silicon dioxide, silicon-on-insulator (SOI), and silicon-on-semiconductor (SOS), substrates with a top layer of one of the above, and any semiconducting substrate. For the purpose of metal epitaxy, crystalline REO is a superior material compared to YSZ. For a start, the interface between the crystalline REO and the substrate is set as part of the epitaxial process. With the appropriate choice of rare earth oxide, crystalline REO templates may be epitaxially grown that are 100% (or nearly 100%) cubic with no secondary phase. Other parameters and process characteristics of crystalline REO that are beneficial to the overall epitaxial stacks are an oxide-silicon interface that is free of any parasitic charge, a higher density than YSZ (8.6 to 6.1 g/cm3), and a 5× better thermal conductivity than YSZ. In addition to serving as a template for epitaxial metal growth, the crystalline REO layer may also prevent interdiffusion between the epitaxial metal layer and any substrate below. This prevents the formation of, for example, unwanted metal silicides (where the substrate is silicon).

FIG. 1 shows an example diagram illustrating a layered structure 400 according to an illustrative embodiment. Structure 100 includes a substrate 102, an REO layer 104, grown over the substrate 102, a metal layer 106 grown epitaxially over the REO layer 104, and a semiconductor layer 108 grown epitaxially over the metal layer 106. The thickness of the REO layer 104 is defined as tox where typically the thickness of the oxide may be defined as $0 \le tox \le 500$ nm. The layer structure 100 depicted in FIG. 1 may be manufactured in a single epitaxial process, either molecular beam epitaxy (MBE), metalorganic vapor phase epitaxy (MOCVD) or any of the other well-known epitaxial deposition techniques. As required be the process, a deposition tool to deposit the material may either be single chamber, or use any of the well-known cluster tool formats where specific parts of the process are done in different interconnected chambers, or multiple deposition tools may be used. The crystalline REO layer 104 is a template for the epitaxial metal layer 106, which may comprise one or more constituent epitaxial metal layers. The semiconductor layer 108 may comprise one or more of a III-nitride material, a III-V material, and a Group IV material. III-V materials include one or more species from Group III of the Periodic Table (such as B, Al, Ga, In, and Tl) and one or more species from Group V of the Periodic Table (such as N, P, As, Sb, and Bi). III-nitrides are III-V materials and include a species from Group III and nitrogen. Examples of III-nitride materials include GaN, $In_xAl_yGa_{1-x-y}N$ ($0 \le x, y \le 1$), and/or AlN. Examples of other III-V materials include one or more of GaAs, InP, InAs, InSb, InGaAs, GaAsP, InGaAsP, and the like. In some embodiments, the oxygen-to-metal ratio for the REO layer 104, ranges from 1 to 2. In some embodiments, the oxygen to metal ratio for the REO layer 104 may be between 1.4 to 1.6.

The layer structure 100 of FIG. 1 may be grown over a substrate 102 such as a silicon substrate. If the semiconductor material in a filter is epitaxial, then it lends itself to integration of additional semiconductor elements (not necessarily directly electrically connected to the filter) that may be grown above the filter. For example, a transistor (examples of which include a field effect transistor, a high electron mobility transistor, and a heterojunction bipolar transistor) may be grown over the filter, thus reducing the chip area required for a given system.

Figure 2:
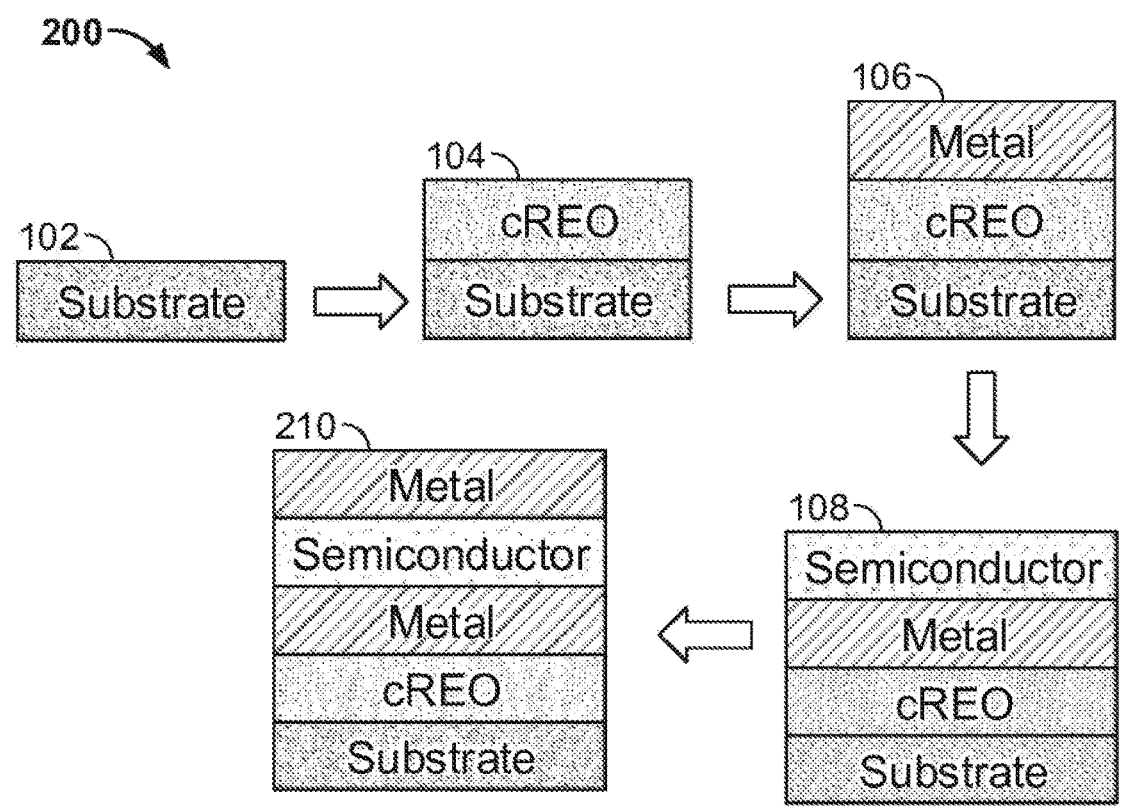
FIG. 2 depicts a flow diagram to grow the layered structure shown in FIG. 1, according to an illustrative embodiment.

FIG. 2 depicts a process schematic 200 that illustrates a single epitaxial process for fabricating the structure depicted in FIG. 1. A crystalline REO layer 104 is epitaxially grown over a substrate 102. A metal layer 106 is epitaxially grown over the crystalline REO layer 104. A semiconductor layer 108 is epitaxially grown over the metal layer 106. In some embodiments, an additional metal layer 210 may be epitaxially grown over the semiconductor layer 108. Each of the layers depicted in FIG. 2 may include one or more sub-layers. The composition of each layer is described in further detail in FIGS. 3-13.

The epitaxial metal used could be a rare earth metal or a metal such as ruthenium or molybdenum, or other representative metals listed in Table 1 below. Attributes to consider for selecting the metal element for the epitaxial metal layer 210 include resistivity, and also density, Young's modulus and refractive index which determine optical and acoustic properties of the layer. Other metals not listed in Table 1 may also be used.

TABLE 1

Example Metals for the Metal Layer

| Metal | Crystal Structure | Resistivity (nΩ-m) | Density (g/cm$^3$) | Young's modulus (GPa) | Refractive index @ 635 nm |
|---|---|---|---|---|---|
| Ruthenium | hcp | 71 | 12.5 | 447 | |
| Molybdenum | bcc | 53 | 10.3 | 329 | 3.71 |
| Platinum | fcc | 105 | 21.5 | 168 | 2.33 |
| Copper | fcc | 17 | 8.9 | 119 | 0.23 |
| Aluminum | fcc | 28 | 2.7 | 70 | 1.39 |
| Neodymium | fcc | 643 | 7.0 | 41 | |
| Gadolinium | dhcp | 1310 | 7.9 | 55 | |
| Erbium | hcp | 860 | 9.1 | 70 | |
| Ytterbium | fcc | 250 | 6.9 | 24 | |
| Scandium | hcp | 562 | 2.9 | 74 | |

Table 1: Representative metals and selected properties
(hcp—hexagonal close packed, fcc—face centered cubic, bcc—body centered cubic, dhcp—double hexagonal close packed)

For example, the substrate 102 may be composed of silicon; the REO layer 104 may be composed of erbium oxide having an oxygen-to-metal ratio of 1.5 ($ErO_{1.5}$), and the first metal layer 106 may be composed of molybdenum (Mo). The first semiconductor layer may be composed of $Al_xSc_{1-x}N$ (0≤x<1). The substrate 102, when composed of Si, may have a crystal orientation of <111>, and the first metal layer, when composed of Mo, has a crystal orientation of <110>. In this example, the oxygen-to-metal ratio in the REO may have a range between 1.4 and 1.6.

For another example, the substrate 102 that is composed of silicon may have an orientation of <100>, the REO layer 104, when composed of $ErO_{1.5}$ may have a crystal orientation of <110>, and the first metal layer 106, when composed of Mo, may have a crystal orientation of <211>. In this example, the oxygen-to-metal ratio in the REO may have a range between 1.4 and 1.6, and the semiconductor layer 108 may have a variety of compositions.

Figure 3:
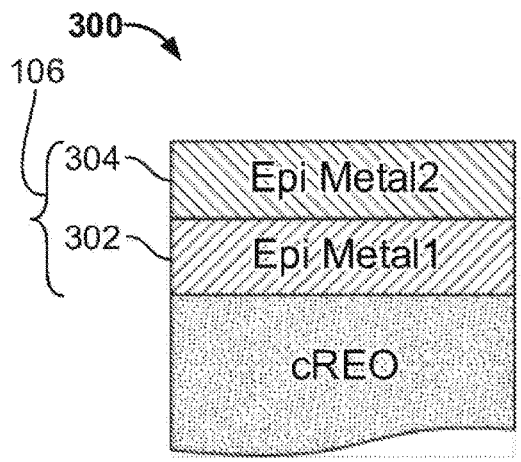
Figure 4:
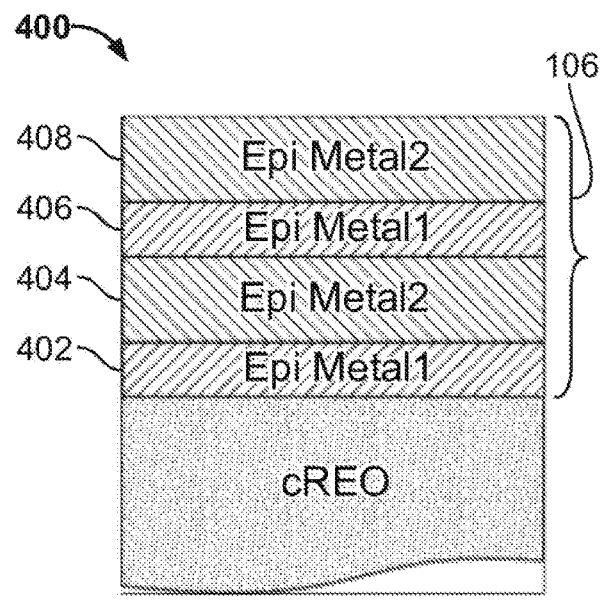
Figure 5:
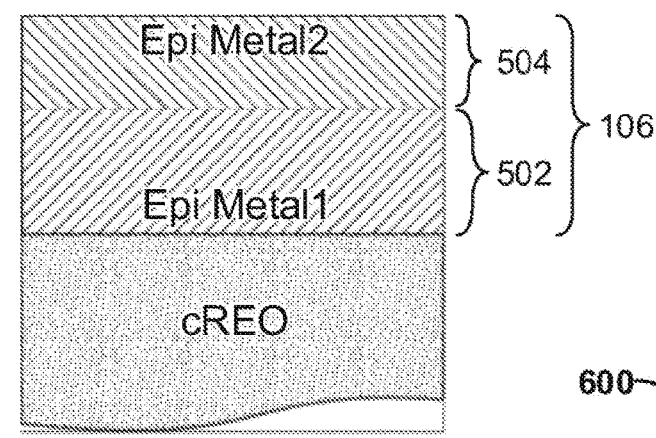

FIGS. 3-5 depict structures including multiple epitaxial metal layers over a crystalline REO layer 104. The epitaxial metal layers in FIGS. 3-5 may include multiple metal layers. Multiple metal layers may be grown either as a stacked as in FIGS. 3-4, e.g., a step change from one type of metal to another type of metal, or as graded change as shown in FIG. 5. For illustrative purpose only, two types of metal layers are depicted in FIGS. 3-5, but more than two types of metal layers may be used in the structure in a similar manner as shown in FIGS. 3-5.

FIG. 3 shows an example diagram illustrating a layered structure 300 according to an illustrative embodiment. Structure 300 includes a first metal layer 302 epitaxially grown over REO layer 104, a second metal layer 304 epitaxially grown over the first metal layer 302 in a stepwise type configuration. In some embodiments, the metal in the first metal layer 302 and the second metal layer 304 may be same. In some embodiments, the metals in the first layer 302 and the second metal layer 304 may be different. In some embodiments, the first metal layer 302 and the second metal layer 304 may have the same thickness. In some embodiments, the first metal layer 302 may have a thickness different from the second metal layer 304.

FIG. 4 shows an example diagram illustrating a layered structure 400 according to an illustrative embodiment. Structure 400 includes multiple alternating layers of a first metal (layers 402, 406) and a second metal (layers 404, 408) epitaxially grown over REO layer 104 in a superlattice type configuration. In some embodiments, the metals in the first metal layers 402, 406 and the second metal layers 404, 408 may be the same. In some embodiments, the metal in the first layers 402, 406 and the metal in the second layers 404 and 406 may be different. In some embodiments, the first metal layers 402, 406 and the second metal layers 404, 408 may have the same thickness. In some embodiments, the first metal layers 402, 406 may have a thickness different from the second metal layers 404 and 408. It is to be noted that two repetitions of two different types of metal layers are shown in FIG. 4 for illustrative purpose only, and a different number of repetitions (e.g., three, four, five, etc.) may be used in the structure.

FIG. 5 shows an example diagram illustrating a layered structure 500 according to an illustrative embodiment. Structure 500 includes a metal layer 106 epitaxially grown over REO layer 104, where the metal layer 106 has a first region 502 and a second region 504 where a first concentration of a first metal and a second concentration of a second metal is modified in a graded configuration. The grading of the first and second concentrations of the first and second metal in FIG. 5 may be linear (e.g., a linear change in composition from the first metal to the second metal), superlinear (e.g., a higher order polynomial), sublinear, or stepwise (e.g., discrete changes in material composition). In some embodiments, the first concentration may have a first value in the first region 502 and a second value in a second region 504. The concentration of the first metal may vary across the thickness of layer 106. Similarly, the second concentration of the second metal may have a third value in the first region 502 and a fourth value in the second region 504. The concentration of the second metal may vary across the thickness of layer 106.

The layer structures 300-500 depicted in FIGS. 3-5 may be included in a radio-frequency (RF) filter. The semiconductor layer 108 grown over the epitaxial metal layer 106 may be a piezoelectric material that acts as a coupled electro-mechanical resonator. The first epitaxial metal layer (302, 402) may be a first electrode for the RF filter, and the second metal layer (304, 404) may be a second electrode for the RF filter. Epitaxial metal layers are particularly useful for electrodes in RF filters because they provide the high conductivity of metal with single-crystal structures that serve as templates for the subsequent growth of single-crystal layers (e.g., the semiconductor layer) over the metal layers. Single-crystal semiconductor layers are useful as the semiconductor material in RF filters because they provide higher piezoelectric coefficients, narrower bandwidths, and lower losses. In part the increased performance is due to quality and crystalline registry of the epitaxial metal electrodes, which results in higher quality of subsequent films.

Any of the structures depicted in FIGS. 3-5 may be included in optical devices. One such application would be in a distributed Bragg reflector (DBR). For a DBR, one critical consideration is the index of refraction between the constituent layers. The more dissimilar the index of refraction, the fewer periods required and the wider the stop band is. This offers a route to reducing total layer stack thickness and thereby reduction in manufacturing cost/complexity For example in a DBR employing the semiconductors AlN and GaN the delta in refractive index at 420 nm is 0.34. If the two materials were changed to AlN over epitaxial Mo this difference would increase to 0.85.

Figure 19:
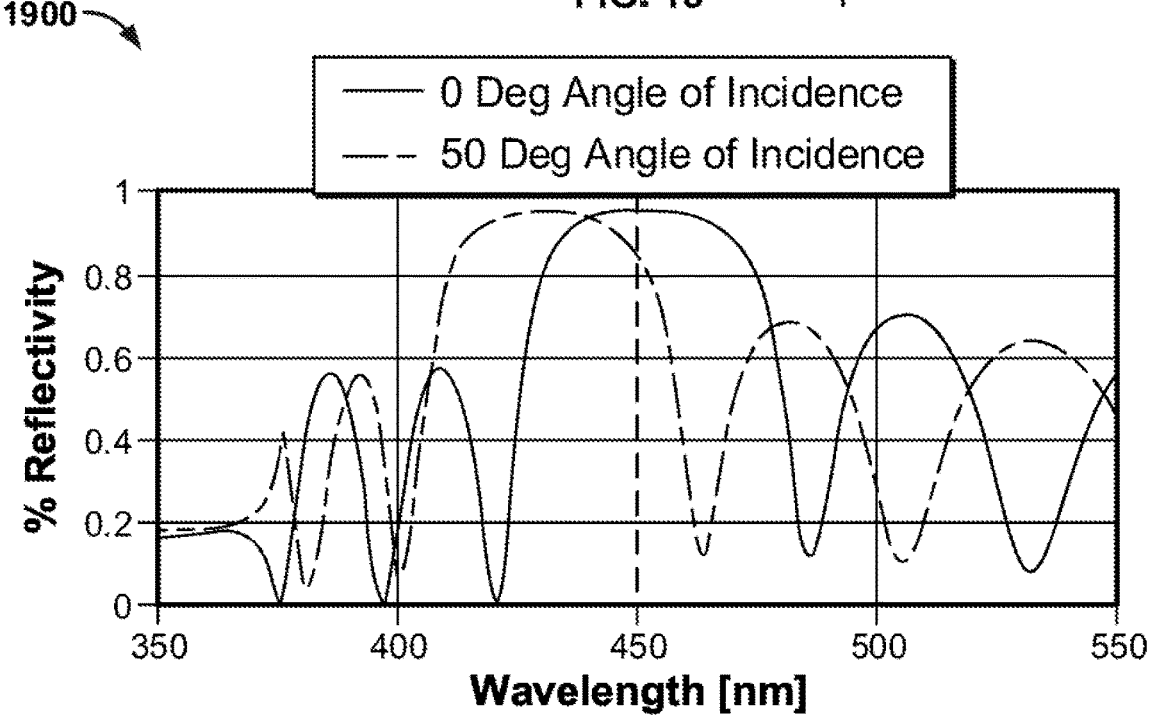
FIG. 19 depicts a graph showing how DBR is constructed from 11 periods of AlN and GaN, according to an illustrative embodiment.
Figure 20:
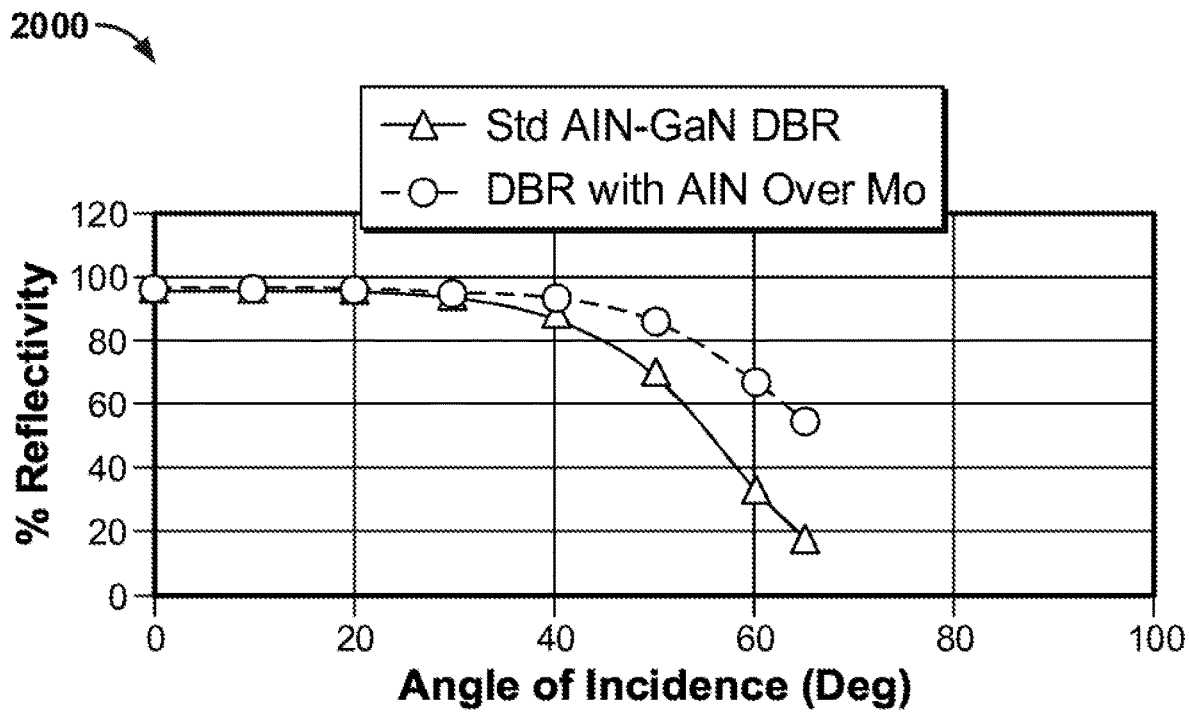
FIG. 20 depicts a calculated reflectivity at 450 nm that is plotted for both for AlN—GaN DBR and AlN—GaN DBR that is constructed on single pair of AlN over Mo, according to an illustrative embodiment.

In many photonic devices all the light does not travel normal to the epitaxial surface. When the DBRs is constructed from semiconductors offering only a small difference in refractive index there is a strong dependence of reflectivity on the angle of incidence. Examples of performance of reflectivity of layered structure 100 in comparison to a layered structure 100 without the epitaxial metal layer 106 are shown in FIGS. 18-20.

Figure 6:
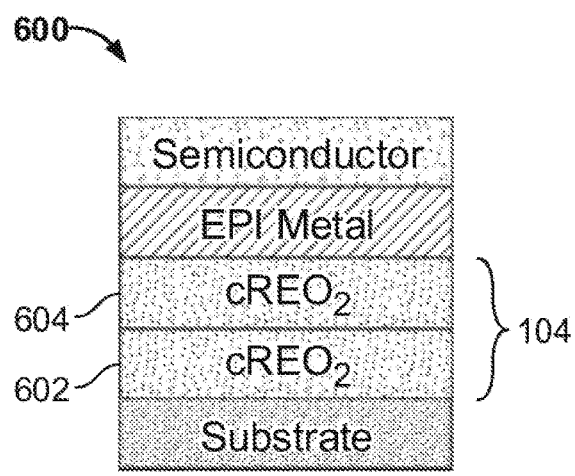

FIGS. 6-8 depict structures including multiple crystalline REO layer layers over a substrate 102. The REO layer layer 106 in FIGS. 6 and 7 may include multiple REO layer layers. Multiple rare earth oxide layers may be grown either as a stacked as in FIGS. 6-7, e.g., a step change from one type of REO to another type of REO, or a graded change as shown in FIG. 8. In some embodiments, there may be instances where there is a first optimum REO to be placed adjacent to the substrate 102 and a second optimum REO to be placed to support epitaxy of metal layer 106. For illustrative purpose only, two types of REO layers are depicted in FIGS. 6-8, but more than two types of REO layers may be used in the structure in a similar manner as shown in FIGS. 6-8.

FIG. 6 depicts a layer structure 600 that includes a first REO layer 602 epitaxially grown over substrate 102, a rare earth oxide layer 604 epitaxially grown over the first rare earth oxide layer 602 in a stepwise type configuration. In some embodiments, the rare earth metal in the first rare earth oxide layer 602 and the second rare earth oxide layer 604 may be same. In some embodiments, the rare earth metals in the first rare earth oxide layer 602 and the second rare earth oxide layer 604 may be different. In some embodiments, the first REO layer 602 and the second REO layer 604 may have a same thickness. In some embodiments, the first REO layer 602 may have a thickness different from the second REO layer 604. In some embodiments, the first rare earth metal may have a first concentration in the first layer 602 and a second concentration in the second layer 604. Similarly, the second rare earth metal may have a third concentration in the first layer 602 and a fourth concentration in the second layer 604. In some embodiments, the concentration of oxygen may be different in the first layer 602 and the second layer 604.

FIG. 7 depicts a layer structure 700 that includes multiple alternating layers of a first REO (layers 702, 706) and a second REO (layers 704, 708) epitaxially grown over substrate 102 in a superlattice type configuration. In some embodiments, the rare earth metals in the first REO layers 702, 706 and the second rare earth metal oxide layers 704, 708 may be same. In some embodiments, the rare earth metals in the first layers 702, 706 and the rare earth metal in the second layers 704 and 706 may be different. In some embodiments, the first REO layers 702, 706 and the second REO layers 704, 708 may have the same thickness. In some embodiments, the first REO layers 702, 706 may have a thickness different from the second REO layers 704 and 708. In some embodiments, the first rare earth metal may have a first concentration in the layer 702 and a second concentration in the layer 704. Similarly, the second rare earth metal may have a third concentration in the layer 702 and a fourth concentration in the layer 704. In some embodiments, the concentration of oxygen may be different in layer 702 and the layer 704. It is to be noted that two repetitions of two different types of REO layers are shown in FIG. 7 for illustrative purpose only, and a different number of repetitions (e.g., three, four, five, etc.) may be used in the structure.

FIG. 8 shows an example diagram illustrating a layered structure 800 according to an illustrative embodiment. Structure 800 includes a REO layer 104 epitaxially grown over substrate 102, where the REO layer 106 has a first region 802 and a second region 804 where a first concentration of a first rare earth metal and a second concentration of a second rare earth metal is modified in a graded configuration. The grading of the first and second concentrations of the first and second rare earth metal in FIG. 8 may be linear (e.g., a linear change in composition from the first metal to the second metal), superlinear (e.g., a higher order polynomial), sublinear, or stepwise (e.g., discrete changes in material composition). In some embodiments, the first concentration of the first rare earth metal may have a first value in the first region 802 and a second value in a second region 804. The concentration of the first rare earth metal may vary across the thickness of layer 106. Similarly, the second concentration of the second metal may have a third value in the first region 802 and a fourth value in the second region 804. The concentration of the second metal may vary across the thickness of layer 106.

FIG. 9 depicts shows an example diagram illustrating a layered structure 900 according to an illustrative embodiment. Structure 800 depicts an example of the structure shown in FIG. 1, where the semiconductor layer 108 is a III-nitride layer, in particular an $Al_{1-x}Sc_xN$ (0≤x≤1) layer, the metal layer 106 is a Mo layer, the REO layer 104 is an $Er_2O_3$ layer, and the substrate 102 is a Si <111> substrate. Other examples of the structure shown in FIG. 9 are possible, and each of the layers may include one or more sub-layers as described in FIGS. 3-8.

In some embodiments, the layered structure 100 as shown in FIG. 1 may be modified to include an interlayer either between the epitaxial metal layer 106 and semiconductor 108 or between the REO layer 104 and the epitaxial metal layer 106. The purpose of such a layer is to allow chemical or crystallographic engineering of the transition from oxide to metal or metal to semiconductor. Chemical engineering may include encouraging nucleation or migration of the semiconductor or metal atoms during initial epitaxial deposition of the semiconductor or metal layer. Crystallographic engineering may include aiding in a transition in crystal structure or lattice constant between the metal and semiconductor layers. An example of a transition in crystal structure is a transition from a hexagonal-type crystal structure to a cubic-type crystal structure.

Figure 10:
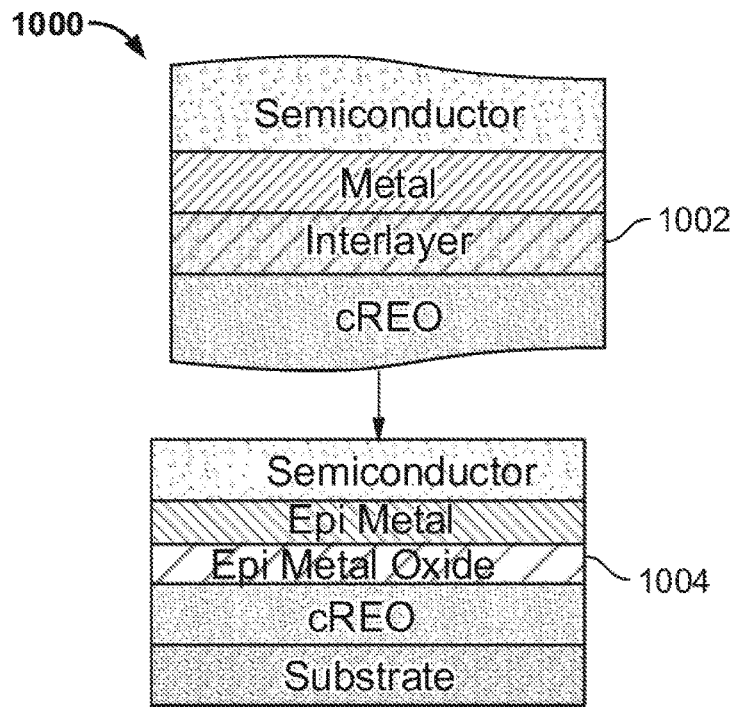

FIG. 10 shows an example diagram illustrating a layered structure 1000 according to an illustrative embodiment. Structure 1000 depicts an epitaxial metal 106 over an interlayer 1002 which is epitaxially grown over the crystalline REO layer 104. In some embodiments, the interlayer 1002 may be a metal oxide 1004 made with a combination of the metal in the epitaxial metal layer 106 and oxygen.

Figure 11:
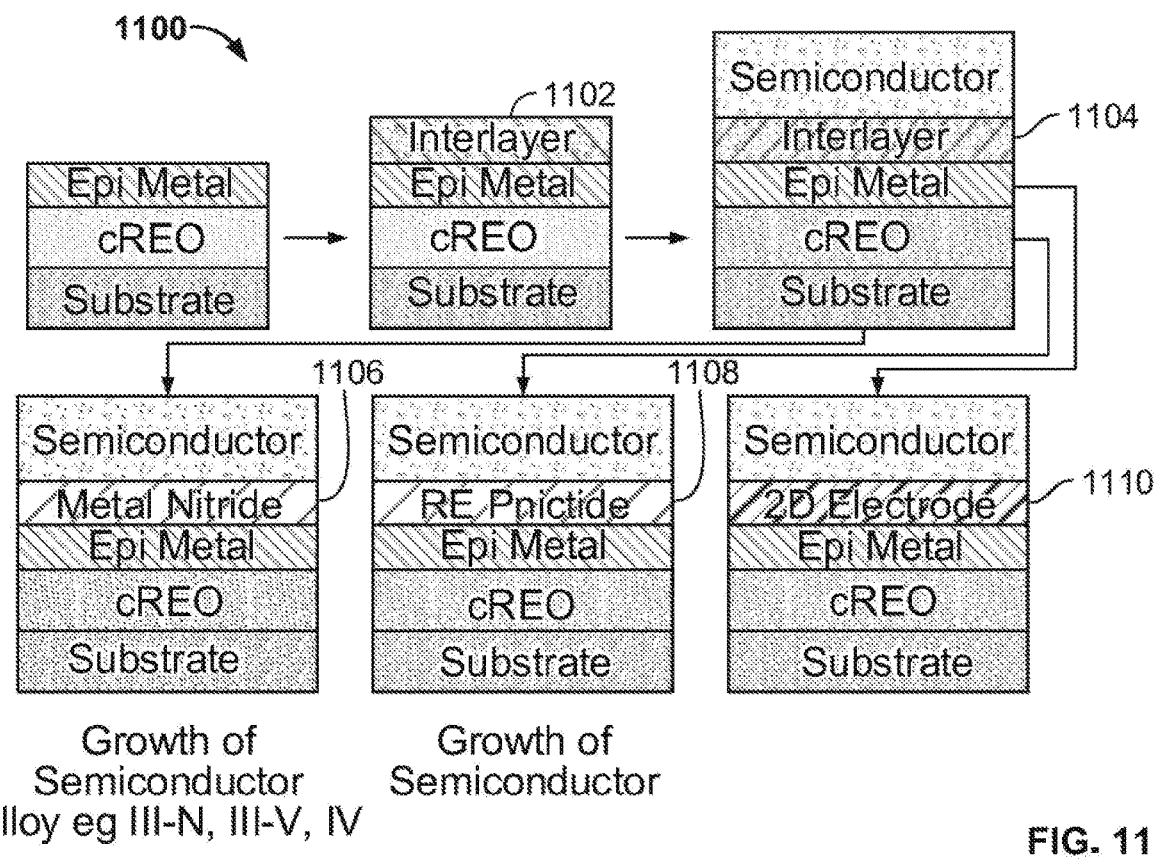

FIG. 11 shows an example diagram illustrating a layered structure 1100 according to an illustrative embodiment.

Structure 1100 depicts an epitaxial metal layer 106 over a REO layer 104, an epitaxial interlayer 1102 over the epitaxial metal layer, and an epitaxial semiconductor layer 106 over the interlayer 1102. In some embodiments, the interlayer may be composed of a metal silicide. In some embodiments, the interlayer may be composed of metal nitride 1104. In some embodiments, the interlayer 1102 may be composed of rare earth pnictides 1106 that commonly include rare earth nitride, rare earth arsenide, and rare earth phosphide. In some embodiments, the interlayer 1102 may be composed of a two-dimensional (2D) electrode 1108.

In some embodiments, more semiconductors of different composition/types might be epitaxially grown over the other semiconductor layer 108. In some embodiments, a second metal may be grown over the semiconductor layer. For this embodiment any of the previously described metal epitaxy schemes may be utilized, and any of the interlayers previously described that were epitaxially grown between the metal and the semiconductor could be used for the overall epitaxial process depending on what features were required of the final epitaxial stack. The layers above the semiconductor do not have to match those below the semiconductor. For example, the layers above the semiconductor may be the same or different from layers below the semiconductor In some embodiments, an epitaxial metal layer may be grown over a semiconductor layer 108. In some embodiments three possible epitaxial interlayers, a metal silicide, a metal nitride, and a rare earth pnictide may be grown between the semiconductor layer 108 and the epitaxial metal layer. If the choice was made to grow a n epitaxial metal layer over semiconductor 108, then any or all of the above examples may be repeated for the purpose of epitaxially growing another semiconductor layer over metal.

Figure 12:
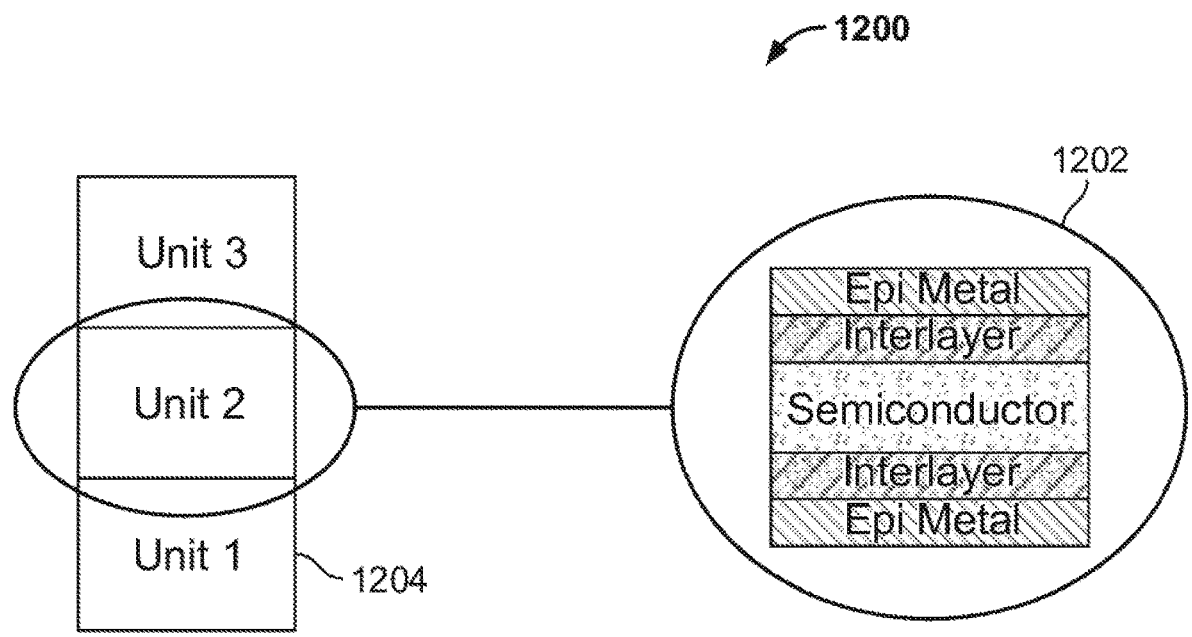

FIG. 12 shows an example diagram illustrating a device composed of units of layered structures 1202 and 1204 according to an illustrative embodiment. Structure 1200 depicts an example of repeated metal/semiconductor structures with optional interlayers. FIG. 12 depicts a layer stack of three units 1204. Layer stacks may contain other numbers of units, but three are shown here for illustrative purposes. Each unit may be the same, or one or more of the units in a layer stack may be different. Layered structure 1202 depicts an exemplary unit within the layer stack 1204. This exemplary unit contains a first interlayer epitaxially grown over a first epitaxial metal layer, a semiconductor layer 108 epitaxially grown over the first interlayer, a second interlayer epitaxially grown over the semiconductor layer, and a second epitaxial metal layer epitaxially grown over the second interlayer. Any of the units within a layer stack may include none, one, or both of the first and second interlayers. In addition, the second epitaxial metal layer in one unit may be the same as the first epitaxial metal layer in the unit above. One or both of the epitaxial metal layers in a unit may be a single metal, a graded metal layer, a metal layer with multiple sub-layers, and/or a superlattice with multiple metal layers. Layer stacks such as those depicted in 1204 may be used in photonic applications. For example, a layer stack may be a metal-semiconductor mirror, such as a DBR.

Figure 13:
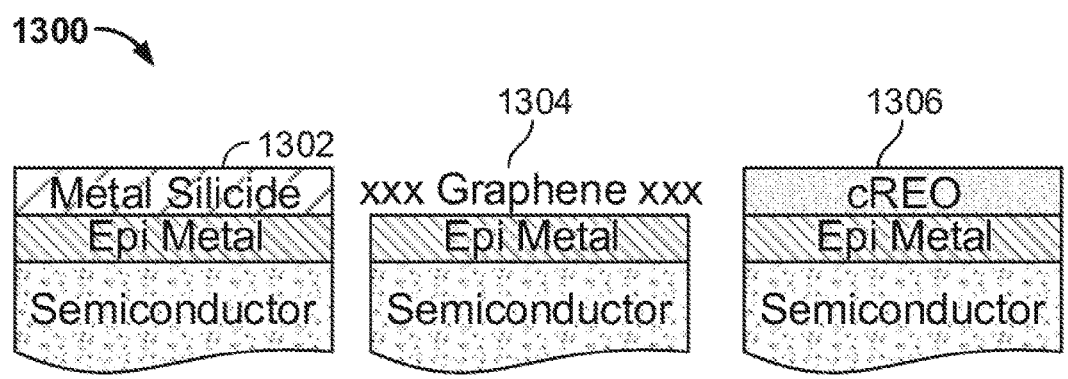

FIG. 13 shows an example diagram illustrating layered structures 1302, 1304, 1306 according to an illustrative embodiment. Structures 1302, 1304, and 1306 depict examples of final epitaxial layers to match the layers below to ex-situ processing and/or device operation. These include but are not limited to the use of a metal silicide to protect the upper metal layer from oxidation as shown in 1302, the addition of graphene or other 2D structures to enhance conductivity as shown in 1304, and the addition of a crystalline REO layer either as a dielectric or an insulator to electrically isolate the underlying epitaxial stack as shown in 1306. In some embodiments, a second epitaxial metal layer may be grown over the REO layer as grown over the semiconductor 108. Note although these three uppermost layers are shown as single layer entities it is expected that provision of such layers may require additional layers not shown here.

Figure 14:
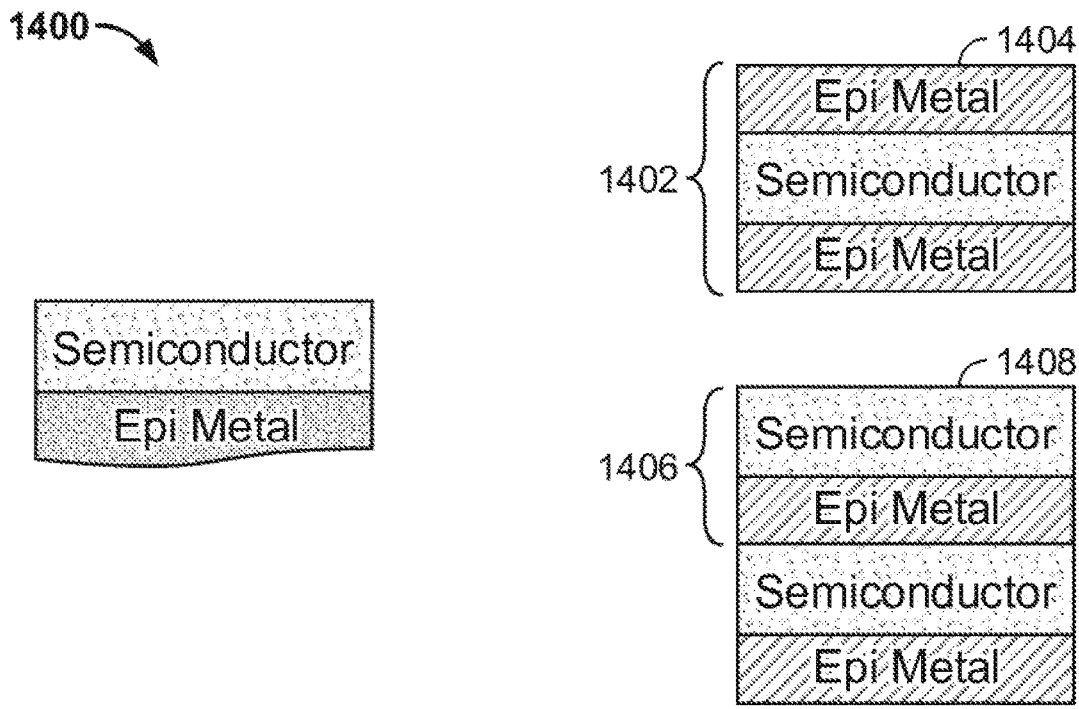

FIG. 14 shows an example diagram illustrating modifications to layered structures 100 according to an illustrative embodiment. Structure 1402 depicts as second epitaxial metal layer 1404 over semiconductor layer 108. Structure 1406 depicts a second semiconductor layer 1408 grown over the second epitaxial metal layer 1404. In some embodiments, a combination of the second epitaxial metal layer 1404 and the second semiconductor layer 1408 may be a mirror. The layer above the second epitaxial metal layer 1404 may be used as a template for a next phase of epitaxy to deliver additional functionality. Growth of an oxide may electrically isolate portion 1406 from layer structure 100 over which portion 1406 may be grown.

Figure 15:
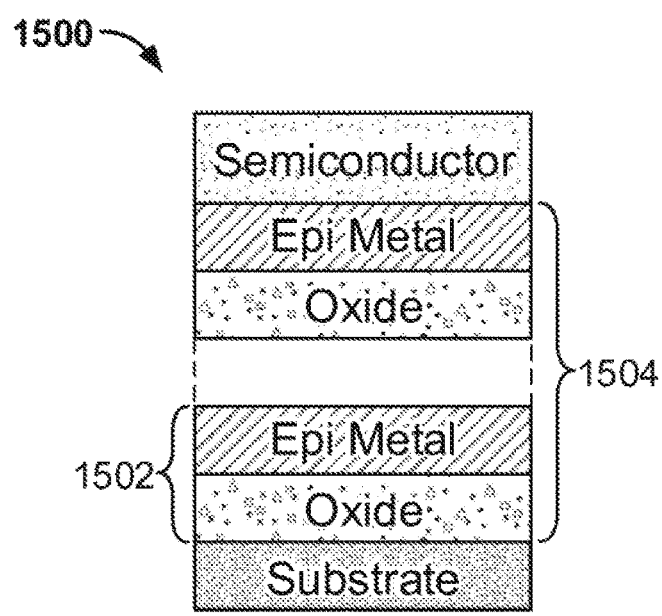

FIG. 15 shows an example diagram illustrating layered structure 1500 according to an illustrative embodiment. Structure 1500 depicts a repetition pattern for a combination 1502 of REO layer 104 and epitaxial metal layer 106 multiple times to build a stack 1504 before semiconductor 108 is grown over the stack. In some embodiments, the portion 1502 may be 1, 2, 3 . . . 20 . . . or any other number of times before growing semiconductor 108 over the stack 1504.

Figure 16:
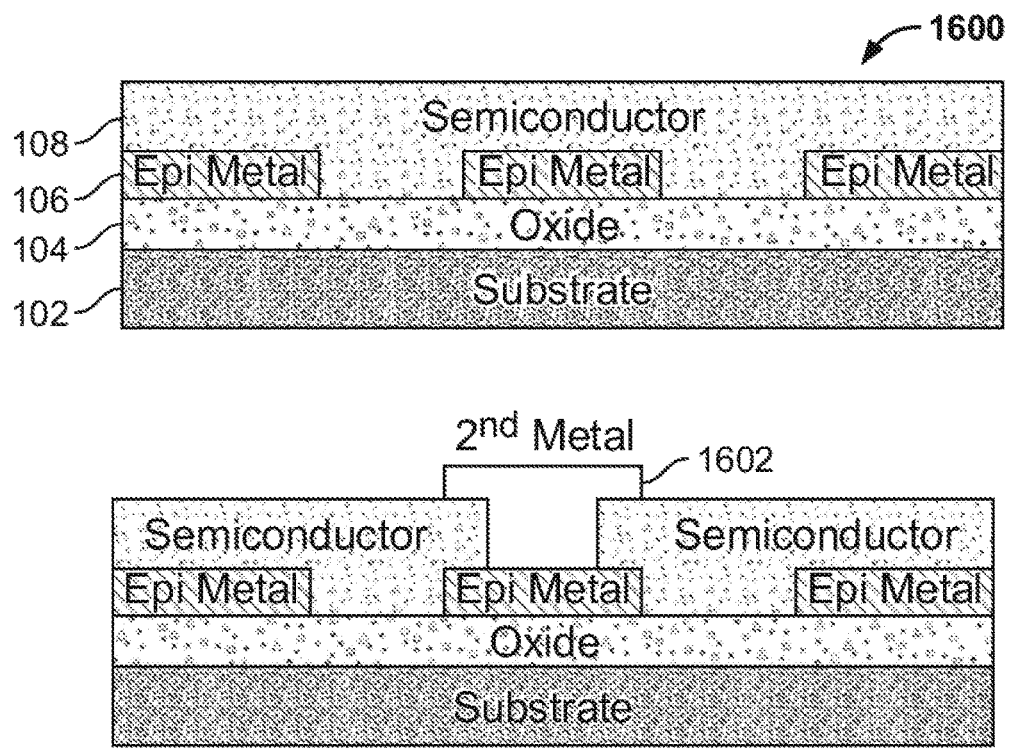

FIG. 16 shows an example diagram illustrating layered structure 1602 and 1606 according to an illustrative embodiment. Structure 1602 depicts an epitaxial metal layer 106 that is segmented either by incorporating a mask within the reactor, a pattern on the surface of the oxide or control of the metal chemistry such that the growth is 3D rather than 2D. In some embodiments, semiconductor layer 108 may be grown as a continuous segment over the segmented metal layer 106. In some embodiments, semiconductor layer 108 may also be segmented either by incorporating a mask within the reactor, a pattern on the surface of the oxide or control of the metal chemistry such that the growth is 3D rather than 2D as shows in 1606. In some embodiments, a second metal layer 1604 may be grown over the fragmented semiconductor layer 108 wherein the metal layer 1404 is grown in the cavities between the various semiconductor segments in layer 108. The second metal layer may be grown over different segments of the semiconductor layer. In some embodiments, upstream processes can access the second metal layer metal and use as a template/seed for additional processing steps (e.g., electroplating of thick contacts). In some embodiments, the semiconductor layer 108 may have different functions if grown over metal or grown over oxide.

Figure 17:
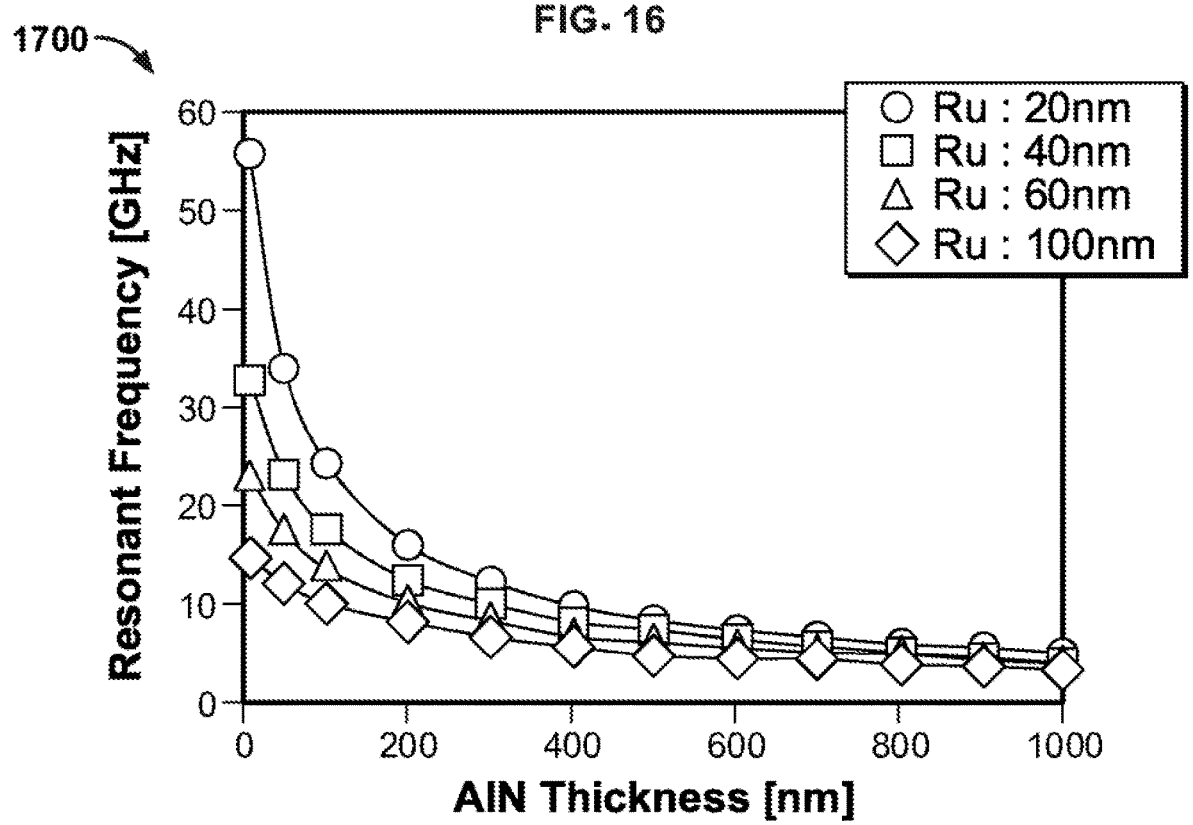
FIG. 17 depicts resonant frequencies as a function of AlN thickness for different thickness metal electrodes, in accordance with an embodiment of the prior art.

FIG. 17 shows resonant frequencies as a function of AlN thickness for different thickness metal electrodes, in accordance with an embodiment of the prior art (from S. Tanifuji et al, Proceedings 2009 IEEE International Ultrasonic Symposium, p. 2170, the entirety of which is incorporated by reference). Here, crystal quality is also important because without it resistivity would increase as thickness decrease due to an increasing effect of defects and grain boundaries in polycrystalline metal layers.

FIG. 19 depicts a graph showing how DBR is constructed from 11 periods of AlN and GaN. As the angle of incidence increase the effective layer thickness results in the stop band shifting to lower wavelengths, meaning that at some angle the design wavelength (un this example 450 nm) will fall outside of the central stop band.

The addition of an AlN over a metal (in this case molybdenum) decreases considerably this sensitivity to the angle of incidence.

FIG. 20 depicts the calculated reflectivity at 450 nm is plotted for both an 11 period AlN—GaN DBR and a 10 period AlN—GaN DBR that is constructed on single pair of AlN over Mo. As may be seen at 60° angle of incidence the addition of the epitaxial metal layer has increased the reflectivity from 30% to 65%.

The epitaxial metal layers result in a larger grain size and less grain boundaries which enables thinner metal layers before losses associated with grains boundaries and defects become significant. Additionally the interfaces between the metal layers and the semiconductor are clean and discrete, both of which reduce the losses of a semiconductor—metal DBR when compared to a polycrystalline/sputtered DBR construct.

Figure 21:
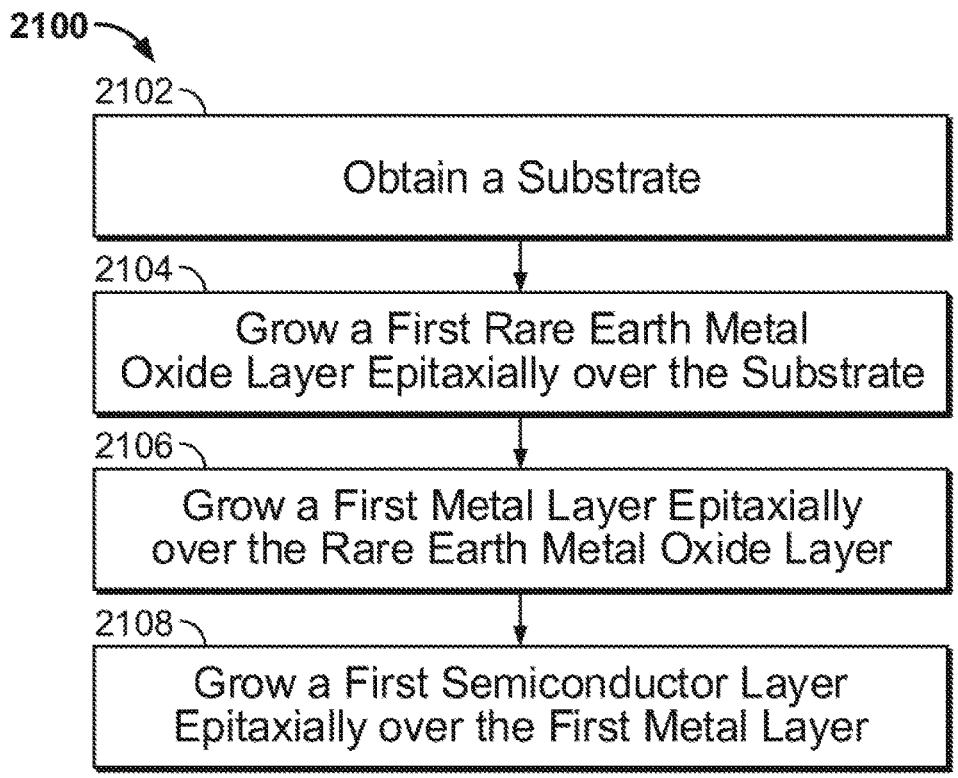
FIG. 21 depicts a flowchart of a method for growing the layered structure shown in FIG. 1, according to an illustrative embodiment.

FIG. 21 is flow chart of a process 2100 growing layered structure 100, according to an illustrative embodiment. The process starts at 2102, when a substrate 102 is obtained. At 2104, a first REO layer 104 is grown over the substrate 102. At 2106 a first metal layer 106 is epitaxially grown over the first REO layer 104. At 2108, a semiconductor layer 108 is epitaxially grown over the first metal layer 106.

At 2102, a substrate (e.g., see substrate 102 in FIG. 1) is obtained. In some embodiments, substrate includes a group IV element selected from a group of silicon (Si), germanium (Ge), silicon on insulator (SOI), and silicon carbide (SiC), wherein the substrate has a crystal orientation of either <100> or <111> with a miscut of upto 10 degrees, in one example.

At 2104, a first a first REO layer (e.g., see REO layer 104 in FIG. 1) epitaxially grown over the substrate.

At 2106, a first metal layer (e.g., see metal layer 106 in FIG. 1) epitaxially grown over the first REO layer.

At 2108, a first semiconductor layer (e.g., see semiconductor layer 104 in FIG. 1) epitaxially grown over the first metal layer.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially-uniform thickness of a material covering a surface. A layer may be either continuous or discontinuous (i.e., having gaps between regions of the material). For example, a layer may completely cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this may mean either (1) the material is in intimate contact with the substrate; or (2) the material is in contact with one or more transitional layers that reside on the substrate.

Single-crystal means a crystalline structure that comprises substantially only one type of unit cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer.

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium on-insulator, and silicon-germanium-on-insulator.

A first layer described and/or depicted herein as "on" or "over" a second layer may be immediately adjacent to the second layer, or one or more intervening layers may be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on,"

or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein may be part of larger structures with additional layers above and/or below those depicted. For clarity, the figures herein may omit these additional layers, although these additional layers may be part of the structures disclosed. In addition, the structures depicted may be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but may be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a substrate;
   a first rare earth oxide layer over the substrate;
   a first metal layer over the first rare earth oxide layer;
   a semiconductor layer including a first semiconductor sublayer over the first metal layer and a second semiconductor sublayer over the first semiconductor sublayer; and
   an interlayer between the first metal layer and the semiconductor layer, configured for transition from metal to semiconductor.

2. The layered structure of claim 1, wherein the substrate is a silicon-on-insulator wafer.

3. The layered structure of claim 2, further comprising:
   a second metal layer over the first metal layer.

4. The layered structure of claim 3, further comprising:
   a second rare earth oxide layer over the second metal layer, wherein the semiconductor layer is over the second rare earth oxide layer.

5. The layered structure of claim 2, wherein the first metal layer includes at least a first portion of a first metal element and a second portion of a second metal element.

6. The layered structure of claim 2, wherein the second metal layer includes at least a first portion of a first metal element and a second portion of a second metal element.

7. The layered structure of claim 2, further comprising:
   a second metal layer over the semiconductor layer.

8. The layered structure of claim 7, further comprising:
   a second rare earth oxide layer over the second metal layer.

9. The layered structure of claim 2, wherein the first metal layer has a non-continuous pattern with a first gap space between a first part of the first metal layer and a second part of the first metal layer.

10. The layered structure of claim 9, wherein the first part of the first metal layer is composed of a first metal element, and the second part of the first metal layer is composed of a second metal element.

11. The layered structure of claim 9, wherein the first sublayer of the semiconductor layer has a non-continuous pattern, and wherein the first sublayer of the semiconductor layer has a first portion and a second portion being separated by the first part of the first metal layer.

12. The layered structure of claim 11, further comprising:
    a metal sulfide portion over the first part of the first metal layer; and
    a metal oxide portion over the second part of the first metal layer.

13. The layered structure of 11, wherein the second sublayer of the semiconductor layer spans over at least the first part of the first metal layer, the second part of the first metal layer, and the first portion of the first sublayer of the semiconductor layer that is within the gap space between the first part and the second part of the first metal layer.

14. The layered structure of claim 13, wherein the first sublayer of the semiconductor layer extends beyond the gap space to cover the first part and the second part of the first metal layer such that the first part and the second part of the first metal layer are not in contact with the second sublayer of the semiconductor layer.

15. The layered structure of claim 13, further comprising:
    a second metal layer over the second sublayer of the semiconductor layer, wherein the second metal layer has a non-continuous pattern including at least a first portion of the second metal layer that does not align with the first part or the second part of the first metal layer.

16. The layered structure of claim 11, wherein the second semiconductor sublayer has a non-continuous pattern that has at least a first part of the second semiconductor sublayer is over the first portion of the first semiconductor sublayer that is within the gap space between the first part and the second part of the first metal layer, and wherein the at least first part of the second semiconductor sublayer does not align with the first part or the second part of the first metal layer.

17. The layered structure of claim 16, wherein the first sublayer of the semiconductor layer extends from the gap space to cover the first part and the second part of the first metal layer.

18. The layered structure of claim 17, further comprising:
    a second metal layer over the second sublayer of the semiconductor layer, wherein the second metal layer has a non-continuous pattern including at least a first portion of the second metal layer that does not align with the first part or the second part of the first metal layer.

19. The layered structure of claim 2, wherein a thickness of the first rare earth oxide layer is greater than 0 nm and at most equal to 500 nm.

20. The layered structure of claim 1, further comprising:
    a second metal layer over the first metal layer.

21. The layered structure of claim 20, wherein the second metal layer includes at least a first portion of a first metal element and a second portion of a second metal element.

22. The layered structure of claim 20, further comprising:
    a second rare earth oxide layer over the second metal layer, wherein the semiconductor layer is over the second rare earth oxide layer.

23. The layered structure of claim 1, wherein the first metal layer includes at least a first portion of a first metal element and a second portion of a second metal element.

24. The layered structure of claim 1, further comprising:
a second metal layer over the semiconductor layer.

25. The layered structure of claim 24, further comprising:
a second rare earth oxide layer over the second metal layer.

26. The layered structure of claim 1, wherein a thickness of the first rare earth oxide layer is greater than 0 nm and at most equal to 500 nm.

27. A layered structure, comprising:
a substrate;
a first rare earth oxide layer over the substrate;
a first metal layer over the first rare earth oxide layer, wherein the first metal layer has a non-continuous pattern with a first gap space between a first part of the first metal layer and a second part of the first metal layer; and
a semiconductor layer including a first semiconductor sublayer over the first metal layer and a second semiconductor sublayer over the first semiconductor sublayer.

28. The layered structure of claim 27, wherein the first part of the first metal layer is composed of a first metal element, and the second part of the first metal layer is composed of a second metal element.

29. The layered structure of claim 27, wherein the first sublayer of the semiconductor layer has a non-continuous pattern, and wherein the first sublayer of the semiconductor layer has a first portion and a second portion being separated by the first part of the first metal layer.

30. The layered structure of claim 29, further comprising:
a metal sulfide portion over the first part of the first metal layer; and
a metal oxide portion over the second part of the first metal layer.

31. The layered structure of claim 29, wherein the second sublayer of the semiconductor layer spans over at least the first part of the first metal layer, the second part of the first metal layer, and the first portion of the first sublayer of the semiconductor layer that is within the gap space between the first part and the second part of the first metal layer.

32. The layered structure of claim 31, wherein the first sublayer of the semiconductor layer extends beyond the gap space to cover the first part and the second part of the first metal layer such that the first part and the second part of the first metal layer are not in contact with the second sublayer of the semiconductor layer.

33. The layered structure of claim 31, further comprising:
a second metal layer over the second sublayer of the semiconductor layer, wherein the second metal layer has a non-continuous pattern including at least a first portion of the second metal layer that does not align with the first part or the second part of the first metal layer.

34. The layered structure of claim 29, wherein the second semiconductor sublayer has a non-continuous pattern that has at least a first part of the second semiconductor sublayer is over the first portion of the first semiconductor sublayer that is within the gap space between the first part and the second part of the first metal layer, and wherein the at least first part of the second semiconductor sublayer does not align with the first part or the second part of the first metal layer.

35. The layered structure of claim 34, wherein the first sublayer of the semiconductor layer extends from the gap space to cover the first part and the second part of the first metal layer.

36. The layered structure of claim 35, further comprising:
a second metal layer over the second sublayer of the semiconductor layer, wherein the second metal layer has a non-continuous pattern including at least a first portion of the second metal layer that does not align with the first part or the second part of the first metal layer.

37. The layered structure of claim 36, wherein the second metal layer with the non-continuous pattern includes at least a second portion of the second metal layer over the first sublayer of the semiconductor layer, and wherein the at least second portion of the second metal layer aligns with the first part of the first metal layer.

38. The layered structure of claim 27, further comprising:
an interlayer between the first metal layer and the semiconductor layer, configured for transition from metal to semiconductor.

39. The layered structure of claim 38, wherein the second metal layer with the non-continuous pattern includes at least a second portion of the second metal layer over the first sublayer of the semiconductor layer, and wherein the at least second portion of the second metal layer aligns with the first part of the first metal layer.

* * * * *